US 8,847,244 B2
(12) United States Patent
Ito

(10) Patent No.: US 8,847,244 B2
(45) Date of Patent: Sep. 30, 2014

(54) PHOTOCOUPLER

(71) Applicant: Kabushiki Kaisha Toshiba, Tokyo (JP)

(72) Inventor: Yoichiro Ito, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/940,179

(22) Filed: Jul. 11, 2013

(65) Prior Publication Data

US 2014/0239314 A1 Aug. 28, 2014

(30) Foreign Application Priority Data

Feb. 28, 2013 (JP) ................................ 2013-038912

(51) Int. Cl.
| H01L 27/15 | (2006.01) |
| H01L 29/16 | (2006.01) |
| H01L 31/12 | (2006.01) |
| H01L 33/00 | (2010.01) |
| H01L 31/153 | (2006.01) |
| H01L 27/146 | (2006.01) |

(52) U.S. Cl.
CPC ........ *H01L 31/153* (2013.01); *H01L 27/14643* (2013.01)
USPC .................. 257/82; 257/83; 257/84; 257/85; 257/E33.077

(58) Field of Classification Search
CPC . H01L 31/167; H01L 25/167; H01L 31/0203; H01L 31/173; H01S 5/183
USPC ........................................................ 438/25
See application file for complete search history.

(56) References Cited

U.S. PATENT DOCUMENTS

| 4,419,586 | A | * | 12/1983 | Phipps ........................ 250/551 |
| 4,665,316 | A | * | 5/1987 | Hodges ........................ 250/551 |
| 4,754,175 | A | * | 6/1988 | Kobayashi et al. ........... 307/117 |
| 4,859,875 | A | * | 8/1989 | Tihanyi et al. ................ 327/424 |
| 5,013,926 | A | * | 5/1991 | Aizawa ........................ 250/551 |
| 5,045,709 | A | * | 9/1991 | Ogawa ........................ 250/551 |
| 5,138,177 | A | * | 8/1992 | Morgan et al. ................ 250/551 |
| 5,221,847 | A | * | 6/1993 | Ziemer ........................ 250/551 |
| 5,389,776 | A | * | 2/1995 | Woodward .............. 250/214 LS |
| 5,559,466 | A | * | 9/1996 | Okumura et al. ............. 327/514 |
| RE35,836 | E | * | 7/1998 | Rodriguez .................... 250/551 |

(Continued)

FOREIGN PATENT DOCUMENTS

| JP | H05-016736 | 5/1993 |
| JP | H05-206507 A | 8/1993 |

(Continued)

*Primary Examiner* — Allen Parker
*Assistant Examiner* — Long Le
(74) *Attorney, Agent, or Firm* — Posz Law Group, PLC

(57) ABSTRACT

A photpcoupler includes: a light emitting element; a first photodiode array; a second photodiode array; a third photo diode array; an enhancement-mode MOSFET; a first depletion-mode MOSFET; and a second depletion mode MOSFET. The light emitting element converts the input electrical signal into the optical signal. A drain current of the enhancement-mode MOSFET is supplied to the external load when the optical signal is ON. A drain current of the first depletion-mode MOSFET is supplied to the external load when the optical signal is OFF and a voltage passing through the second depletion-mode MOSFET switched to the ON state is supplied to the gate of the first depletion-mode MOSFET. And the drain current of the first depletion-mode MOSFET is larger than a drain current of the first depletion-mode MOSFET when a gate voltage of the first depletion-mode MOSFET is zero.

15 Claims, 4 Drawing Sheets

(56) References Cited

U.S. PATENT DOCUMENTS

| | | | | |
|---|---|---|---|---|
| 5,818,926 | A * | 10/1998 | Challis | 379/399.01 |
| 6,002,566 | A * | 12/1999 | Arikawa et al. | 361/93.1 |
| 6,674,471 | B1 * | 1/2004 | Masuyama | 348/312 |
| 2009/0152443 | A1 * | 6/2009 | Tajiri | 250/206 |

FOREIGN PATENT DOCUMENTS

| | | | | |
|---|---|---|---|---|
| JP | EP 0616375 A3 * | 9/1994 | | H01L 31/167 |
| JP | H11-027124 A | 1/1999 | | |
| JP | 2001-119284 A | 4/2001 | | |
| JP | 2006-135752 A | 5/2006 | | |

* cited by examiner

PHOTOCOUPLER

CROSS-REFERENCE TO RELATED APPLICATIONS

This application is based upon and claims the benefit of priority from Japanese Patent Application No. 2013-038912, filed on Feb. 28, 2013; the entire contents of which are incorporated herein by reference.

FIELD

Embodiments described herein relate generally a photocoupler.

BACKGROUND

By using a photocoupler, signal transmission is possible in a state in which the input terminals are electrically insulated from the output terminals.

Therefore, the photocoupler can be used to transmit signals in an electronic device that includes different power supply systems such as a DC voltage system, an AC power supply system, a telephone line system, etc.

In the case where the signal to be controlled on the secondary side is a direct-current voltage, the photocoupler may have a Form C contact operation such as that of a mechanical relay by combining a normally-off transistor and a normally-on transistor.

In such a case, it is necessary to maintain good balance of the operating currents of the two signal paths while maintaining a small chip size.

DETAILED DESCRIPTION

In general, according to one embodiment, a photpcoupler includes: a light emitting element; a first photodiode array; a second photodiode array; a third photo diode array; an enhancement-mode MOSFET; a first depletion-mode MOSFET; and a second depletion mode MOSFET. The light emitting element is configured to convert the input electrical signal into the optical signal. The first photodiode array is configured to generate a first photovoltaic power by the optical signal being incident on the first photodiode array. The second photodiode array is configured to generate a second photovoltaic power by the optical signal being incident on the second photodiode array. The third photodiode array is configured to generate a third photovoltaic power by the optical signal being incident on the third photodiode array. The enhancement-mode MOSFET is configured such that the first photovoltaic power is supplied to a gate of the enhancement-mode MOSFET. The first depletion-mode MOSFET is configured such that the second photovoltaic power is supplied to a gate of the first depletion-mode MOSFET. The second depletion-mode MOSFET is configured such that the third photovoltaic power is supplied to a gate of the second depletion-mode MOSFET. A drain current of the enhancement-mode MOSFET is supplied to the external load when the optical signal is ON. A drain current of the first depletion-mode MOSFET is supplied to the external load when the optical signal is OFF and a voltage passing through the second depletion-mode MOSFET switched to the ON state is supplied to the gate of the first depletion-mode MOSFET. And the drain current of the first depletion-mode MOSFET is larger than a drain current of the first depletion-mode MOSFET when a gate voltage of the first depletion-mode MOSFET is zero.

Embodiments of the invention will now be described with reference to the drawings.

Figure 1:
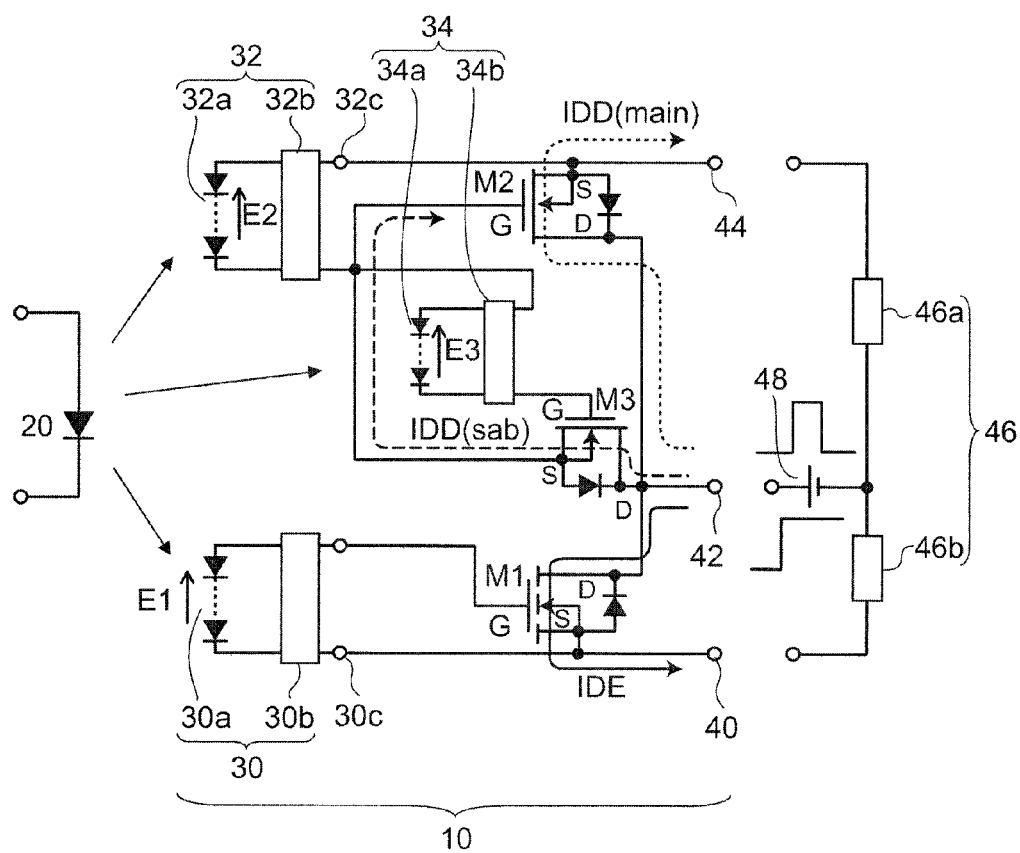
FIG. 1 is a configuration diagram of a photocoupler according to a first embodiment.

FIG. 1 is a configuration diagram of a photocoupler according to a first embodiment.

The photocoupler includes at least a light emitting element (a Light Emitting Diode) 20 and a light receiving circuit 10. The light receiving circuit 10 includes a first photodiode array 30, a second photodiode array 32, a third photodiode array 34, an enhancement-mode MOSFET (M1), a first depletion-mode MOSFET (M2), and a second depletion-mode MOSFET (M3).

The light emitting element 20 converts an input electrical signal into an optical signal. The light emitting element 20 emits, for example, light of a wavelength of red light (650 nm) to infrared light (1000 nm).

The first photodiode array 30, the second photodiode array 32, and the third photodiode array 34 receive the light emitted from the light emitting element 20 and produce first photovoltaic power E1, second photovoltaic power E2, and third photovoltaic power E3. The first to third photodiode arrays 30, 32, and 34 respectively include multiple photodiodes 30a, 32a, and 34a that are connected in series and control circuits 30b, 32b, and 34b.

The first photovoltaic power E1 can be supplied to the gate of the enhancement-mode MOSFET (M1). The second photovoltaic power E2 can be supplied to the gate of the first depletion-mode MOSFET (M2). The third photovoltaic power E3 can be supplied to the second depletion-mode MOSFET (M3).

When the optical signal from the light emitting element 20 is ON, a drain current IDE of the enhancement-mode MOSFET (M1) is supplied to an external load 46b. On the other hand, when the optical signal is OFF, the second depletion-mode zMOSFET (M3) is switched ON and changes the gate of the first depletion-mode MOSFET (M2); and a drain current IDD (main) of the first depletion-mode MOSFET (M2) is supplied to an external load 46a.

In other words, the photocoupler according to the first embodiment converts an input electrical signal into an optical signal, converts the optical signal into an output electrical signal, and supplies the output electrical signal to the external load 46. Because the electrical signal is transmitted via the optical signal, the electrical signal can be transmitted in the state in which the input terminals of the photocoupler are electrically insulated from the output terminals of the photocoupler. Therefore, the photocoupler according to the first embodiment can be used to transmit signals in an electronic device including different power supply systems such as a DC voltage system, an AC power supply system, a telephone line system, etc.

Figure 2:
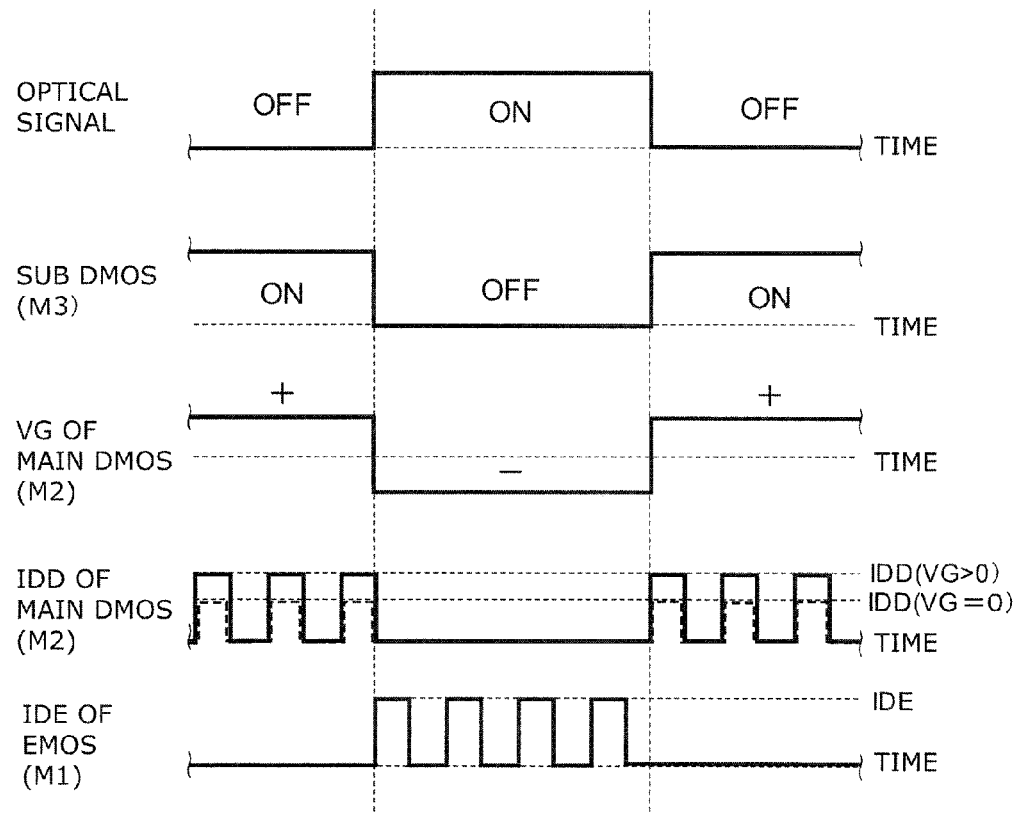
FIG. 2 is an operation waveform diagram of the first embodiment.

FIG. 2 is an operation waveform diagram of the first embodiment.

The light receiving circuit 10 of the photocoupler further includes a first terminal 40 that is connected to a first electrode 30c of the first photodiode array 30 and the source of the enhancement-mode MOSFET (M1), a second terminal 42 that is connected to the drain of the enhancement-mode MOSFET (M1), the drain of the first depletion-mode MOSFET (M2), and the drain of the second depletion-mode MOSFET (M3) to supply a direct current (DC) voltage or a pulse voltage, and a third terminal 44 that is connected to a first electrode 32c of the second photodiode array 32 and the source of the first depletion-mode MOSFET (M2).

A power supply 48 is connected to the second terminal 42; and a direct-current voltage or a pulse voltage is supplied to the second terminal 42. The load 46a is connected between the second terminal 42 and the third terminal 44; and the load 46b is connected between the first terminal 40 and the second terminal 42. The connection between the load 46 and the power supply 48 is not limited to that of FIG. 1.

In FIG. 2, the photovoltaic power is not generated in the third photodiode array 34 when the optical signal from the light emitting element 20 is OFF. Therefore, a gate voltage VG of the second depletion-mode MOSFET (M3) becomes substantially zero; and the second depletion-mode MOSFET (M3) is switched ON. In such a case, the voltage of the second terminal 42 that passes through the second depletion-mode MOSFET (M3) that is switched ON is supplied to the gate of the first depletion-mode MOSFET (M2) during the interval in which the direct-current voltage or the pulse voltage is applied to the second terminal 42. The first depletion-mode MOSFET (M2) can supply, to the external load 46, a drain current (the solid line) that is larger than the drain current (the broken line) of the first depletion-mode MOSFET (M2) when a gate voltage VG of the first depletion-mode MOSFET (M2) is zero.

The gate voltage VG of the first depletion-mode MOSFET (M2) shifts to the positive side in the case where both the first depletion-mode MOSFET (M2) and the second depletion-mode MOSFET (M3) are n-channel MOSFETs.

Figure 3:
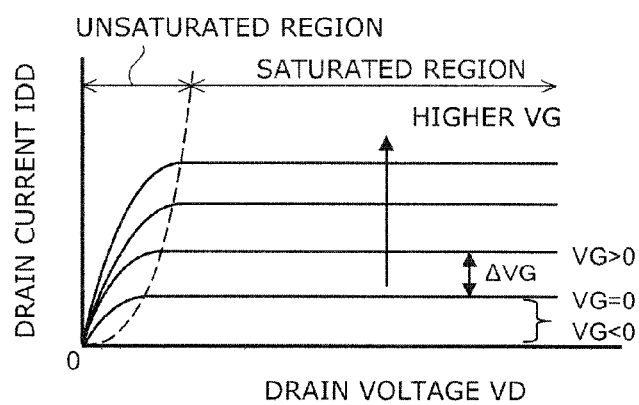
FIG. 3 is a graph showing the dependence of the drain current on the drain voltage of the n-channel depletion-mode MOSFET.

FIG. 3 is a graph showing the dependence of the drain current (IDD) on the drain voltage (VD) of the n-channel depletion-mode MOSFET.

In the depletion-mode MOSFET, the drain current IDD flows even when the gate voltage VG is zero because the channel region is already formed in the manufacturing process. The drain current decreases when the gate voltage VG is caused to be negative; and the drain current approaches zero as the absolute value is increased. On the other hand, the drain current IDD increases as the gate voltage VG is increased on the positive side.

Thus, the second depletion-mode MOSFET (M3) can be called the sub DMOSFET because the second depletion-mode MOSFET (M3) is provided to increase the drain current IDD of the first depletion-mode MOSFET (M2). Conversely, the first depletion-mode MOSFET (M2) can be called the main DMOSFET because the first depletion-mode MOSFET (M2) supplies the current to the external load 46a. The gate width of the sub MOSFET (M3) may be narrower than the gate width of the main DMOSFET.

During the interval in which the optical signal is OFF as shown in FIG. 2, the drain current IDD (VG>0) of the main DMOSFET (M2) can be supplied to the external load 46a according to the direct-current voltage or the pulse voltage applied to the second terminal 42.

When the optical signal is switched ON as shown in FIG. 2, the gate voltage VG becomes negative and the sub DMOSFET (M3) is switched OFF due to the third photovoltaic power E3 generated by the third photodiode array 34. Therefore, the gate voltage VG of the main DMOSFET (M2) cannot be increased even when the voltage is applied to the second terminal 42. The gate voltage VG of the main DMOSFET (M2) becomes negative due to the second photovoltaic power E2 of the second photodiode array 32. Therefore, the main DMOSFET (M2) is switched OFF.

On the other hand, a gate voltage VG1 of the enhancement-mode MOSFET (M1) becomes positive and the enhancement-mode MOSFET (M1) is switched ON by the first photovoltaic power E1. During the interval in which the enhancement-mode MOSFET (M1) is switched ON, the drain current IDE is supplied to the external load 46b via the first terminal 40 and the second terminal 42 when the direct-current voltage or the pulse voltage is applied to the second terminal 42. Although the drain currents IDD and IDE are shown as pulse currents in FIG. 2, these currents of course may be direct currents.

In the photocoupler according to the first embodiment, the enhancement-mode MOSFET (M1) that is normally-off operates as a Form A contact; and the depletion-mode MOSFET (M2) that is normally-on operates as a Form B contact. Therefore, the photocoupler has a 1A1B combination and operates as a Form C contact that can switch the signal path.

The photocoupler of the first embodiment can be called a photorelay.

Although the enhancement-mode MOSFET (M1), the first depletion-mode MOSFET (M2), and the second depletion-mode MOSFET (M3) are n-channel MOSFETs in FIG. 1, each of these may be a p-channel MOSFET. In the case of the p-channel MOSFET, the polarity of the power supply 48 and the polarities of the first, second, and third photodiode arrays 30, 32, and 34 may be reversed.

Figure 4:
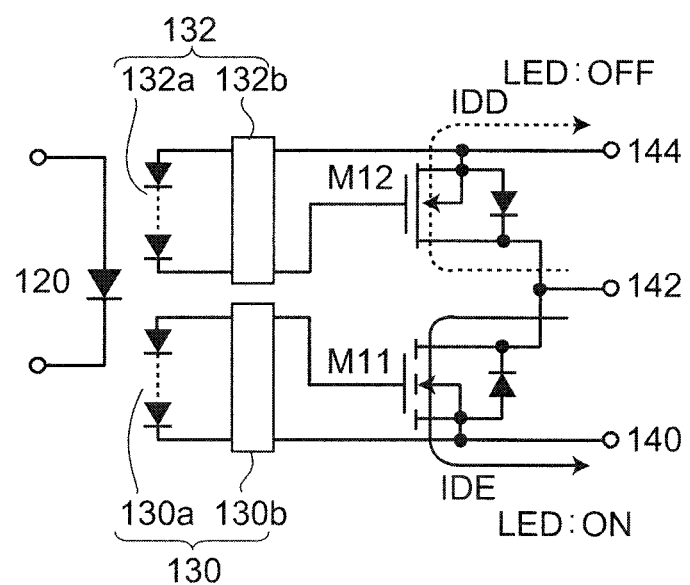
FIG. 4 is a configuration diagram of a photocoupler according to a comparative example.

FIG. 4 is a configuration diagram of a photocoupler according to a comparative example.

The photocoupler includes a light emitting element 120, a first photodiode array 130, a second photodiode array 132, an enhancement-mode MOSFET (M11), and a depletion-mode MOSFET (M12).

The first photodiode array 130 and the second photodiode array 132 respectively generate the first and second photovoltaic powers by receiving the light emitted from the light emitting element 120. The first and second photodiode arrays 130 and 132 respectively include multiple photodiodes 130a and 132a that are connected in series and control circuits 130b and 132b.

The first photovoltaic power can be supplied to the gate of the enhancement-mode MOSFET (M11). The second photovoltaic power can be supplied to the gate of the depletion-mode MOSFET (M12).

It is difficult to increase the drain current in the case where the n-channel depletion-mode MOSFET having the lateral structure is used in a range where VG≤0. On the other hand, in the enhancement-mode MOSFET, it is easy to increase the drain current IDE by increasing the gate voltage VG by the photovoltaic power of the first photodiode array. Therefore, in the comparative example, it is difficult to maintain good balance between the drain current IDD of the depletion-mode MOSFET and the drain current IDE of the enhancement-mode MOSFET.

Conversely, in the first embodiment, the gate voltage VG of the main DMOSFET (M2) is shifted to the positive side by the sub DMOSFET (M3); and the drain current IDD can be increased with good space efficiency of the light receiving circuit 10. As a result, the drain current IDD (VG>0) of the main DMOSFET (M2) can approach the drain current IDE of the enhancement-mode MOSFET (M1); and the balance of the operating currents can be improved.

Figure 5A:
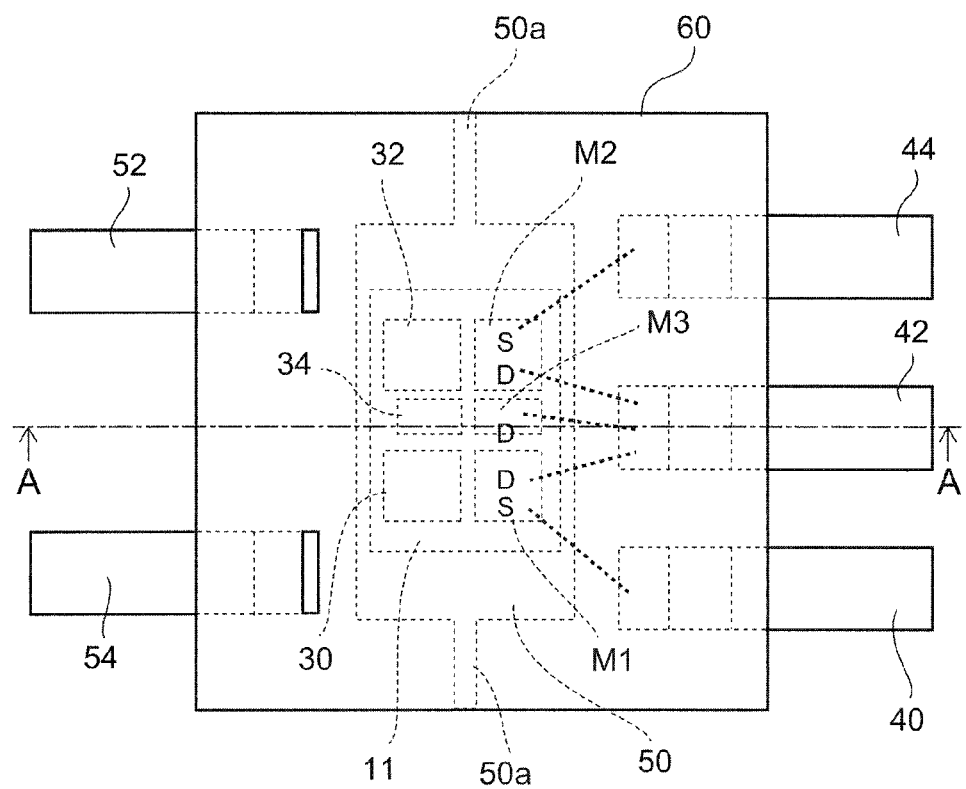
FIG. 5A is a schematic plan view of the light receiving circuit side of the photocoupler of the first embodiment.
Figure 5B:
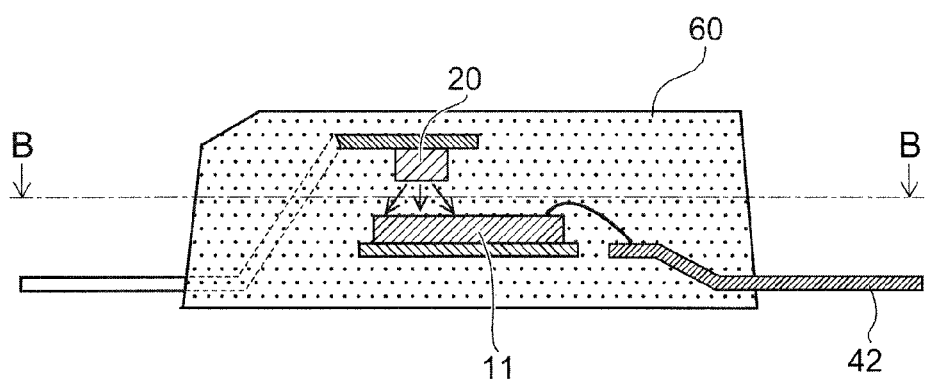
FIG. 5B is a schematic cross-sectional view of the photocoupler along line A-A.

FIG. 5A is a schematic plan view of the light receiving circuit side of the photocoupler of the first embodiment, and FIG. 5B is a schematic cross-sectional view of the photocoupler along line A-A.

The photocoupler of the drawing has a structure in which a light receiving circuit 11 made of one chip such as Si, etc., is mounted on a first leadframe, the light emitting element 20 is mounted on a second leadframe, the light emitting element 20 and the light receiving circuit 11 subsequently are caused to oppose each other, and the light receiving circuit 11 and the light emitting element 20 are integrally formed with a molded resin body 60. The molded resin body 60 covers one end portion of the first terminal 40, one end portion of the second terminal 42, and one end portion of the third terminal 44. One other end portion of the first terminal 40, one other end portion of the second terminal 42, and one other end portion of the third terminal 44 protrude toward the outside from the molded resin body 60 and are connected to interconnect units of a mounting substrate.

The light emitting element 20 is connected to terminals 52 and 54 on the input side.

The light receiving circuit 11 has a lateral structure in which the first to third photodiode arrays 30, 32, and 34, the enhancement-mode MOSFET (M1), the first depletion-mode MOSFET (M2), and the second depletion-mode MOSFET (M3) are disposed in the lateral direction. The layout, the disposition of the terminals, etc., of the light receiving circuit 11 may be different from those of FIGS. 5A and 5B.

The light receiving circuit 11 is bonded to a light receiving circuit die pad unit 50 that is linked to the first leadframe. The light receiving circuit 11 and the first to third terminals 40, 42, and 44 are connected as in FIG. 1 by bonding wires.

After the molded resin body 60 is formed, the die pad unit 50 is cut to be separated from the leadframe in the state in which suspension pins 50a remain. A transparent resin layer is provided in the optical path between the light emitting element 20 and the light receiving circuit 11; and misoperations of the photocoupler due to ambient light can be suppressed by providing a light-shielding resin layer on the outer side of the transparent resin layer.

In the photocoupler, for example, an insulating substrate such as a ceramic, etc., may be used instead of the leadframe. In such a case, the light emitting element 20 and/or the light receiving circuit 11 is disposed on the insulating substrate. Also, the first to third terminals 40, 42, and 44 may be, for example, conductive units, etc., provided in an insulating substrate.

According to the embodiment, a photocoupler is provided in which it is easy to maintain good balance of the operating currents even when the signal path is switched. Such a photocoupler can be used to transmit signals in an electronic device that includes different power supply systems such as a DC voltage system, an AC power supply system, a telephone line system, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A photocoupler configured to convert an input electrical signal into an optical signal, convert the optical signal into an output electrical signal, and supply the output electrical signal to an external load, the photocoupler comprising:
   a light emitting element configured to convert the input electrical signal into the optical signal;
   a first photodiode array configured to generate a first photovoltaic power by the optical signal being incident on the first photodiode array;
   a second photodiode array configured to generate a second photovoltaic power by the optical signal being incident on the second photodiode array;
   a third photodiode array configured to generate a third photovoltaic power by the optical signal being incident on the third photodiode array;
   an enhancement-mode MOSFET configured such that the first photovoltaic power is supplied to a gate of the enhancement-mode MOSFET;
   a first depletion-mode MOSFET configured such that the second photovoltaic power is supplied to a gate of the first depletion-mode MOSFET; and
   a second depletion-mode MOSFET configured such that the third photovoltaic power is supplied to a gate of the second depletion-mode MOSFET;
   a drain current of the enhancement-mode MOSFET being supplied to the external load when the optical signal is ON,
   a drain current of the first depletion-mode MOSFET being supplied to the external load when the optical signal is OFF and a voltage passing through the second depletion-mode MOSFET switched to the ON state is supplied to the gate of the first depletion-mode MOSFET, and
   the drain current of the first depletion-mode MOSFET being larger than a drain current of the first depletion-mode MOSFET when a gate voltage of the first depletion-mode MOSFET is zero.

2. The photocoupler according to claim 1, further comprising:
   a molded resin body configured to cover at least the light emitting element and the first to third photodiode arrays.

3. The photocoupler according to claim 2, further comprising:
   a first terminal connected to a first electrode of the first photodiode array and a source of the enhancement-mode MOSFET;
   a second terminal connected to a drain of the enhancement-mode MOSFET, a drain of the first depletion-mode MOSFET, and a drain of the second depletion-mode MOSFET, the second terminal being configured to supply a direct-current voltage or a pulse voltage; and
   a third terminal connected to a first electrode of the second photodiode array and a source of the first depletion-mode MOSFET,
   the molded resin body further covering one end portion of the first terminal, one end portion of the second terminal, and one end portion of the third terminal,
   one other end portion of the first terminal, one other end portion of the second terminal, and one other end portion of the third terminal protruding outward from the molded resin body.

4. The photocoupler according to claim 3, wherein
   the enhancement-mode MOSFET supplies the drain current of the enhancement-mode MOSFET to the external load via the first terminal and the second terminal when the optical signal is ON, and the first depletion-mode MOSFET supplies the drain current of the first depletion-mode MOSFET to the external load via the second terminal and the third terminal when the optical signal is OFF.

5. The photocoupler according to claim 1, wherein a gate width of the second depletion-mode MOSFET is narrower than a gate width of the first depletion-mode MOSFET.

6. The photocoupler according to claim 1, wherein the first to third photodiode arrays, the enhancement-mode MOSFET, the first depletion-mode MOSFET, and the second depletion-mode MOSFET are included in a light receiving circuit having a lateral structure on one chip.

7. The photocoupler according to claim 6, wherein the light emitting element opposes the light receiving circuit.

8. The photocoupler according to claim 1, wherein the light emitting element is configured to emit red to infrared light.

9. The photocoupler according to claim 2, wherein the molded resin body includes a light-shielding resin layer.

10. A photocoupler, comprising:
 a light emitting element configured to convert an electrical signal input to the light emitting element into an optical signal and emit the optical signal;
 a first photodiode array configured to generate a first photovoltaic power by the optical signal being incident on the first photodiode array;
 a second photodiode array configured to generate a second photovoltaic power by the optical signal being incident on the second photodiode array;
 a third photodiode array configured to generate a third photovoltaic power by the optical signal being incident on the third photodiode array;
 an enhancement-mode MOSFET configured such that the first photovoltaic power is supplied to a gate of the enhancement-mode MOSFET;
 a first depletion-mode MOSFET configured such that the second photovoltaic power is supplied to a gate of the first depletion-mode MOSFET;
 a second depletion-mode MOSFET configured such that the third photovoltaic power is supplied to a gate of the second depletion-mode MOSFET;
 a first terminal connected to a first electrode of the first photodiode array and a source of the enhancement-mode MOSFET;
 a second terminal connected to a drain of the enhancement-mode MOSFET, a drain of the first depletion-mode MOSFET, and a drain of the second depletion-mode MOSFET;
 a third terminal connected to a first electrode of the second photodiode array and a source of the first depletion-mode MOSFET; and
 a molded resin body configured to cover at least the light emitting element and the first to third photodiode arrays,
 a drain current of the enhancement-mode MOSFET being output via the first terminal and the second terminal when the optical signal is ON,
 a drain current of the first depletion-mode MOSFET being output via the second terminal and the third terminal when the optical signal is OFF and a voltage of the second terminal passing through the second depletion-mode MOSFET switched to the ON state is supplied to a gate of the first depletion-mode MOSFET, and
 the drain current of the first depletion-mode MOSFET being larger than a drain current of the first depletion-mode MOSFET when a gate voltage of the first depletion-mode MOSFET is zero.

11. The photocoupler according to claim 10, wherein a gate width of the second depletion-mode MOSFET is narrower than a gate width of the first depletion-mode MOSFET.

12. The photocoupler according to claim 10, wherein the first to third photodiode arrays, the enhancement-mode MOSFET, the first depletion-mode MOSFET, and the second depletion-mode MOSFET are included in a light receiving circuit having a lateral structure on one chip.

13. The photocoupler according to claim 12, wherein the light emitting element opposes the light receiving circuit.

14. The photocoupler according to claim 10, wherein the light emitting element is configured to emit red to infrared light.

15. The photocoupler according to claim 10, wherein the molded resin body includes a light-shielding resin layer.

* * * * *